United States Patent
Sato et al.

(10) Patent No.: US 8,222,626 B2
(45) Date of Patent: Jul. 17, 2012

(54) SEMICONDUCTOR MEMORY DEVICE, METHOD OF MANUFACTURING THE SAME, AND METHOD OF SCREENING THE SAME

(75) Inventors: Mitsuru Sato, Kamakura (JP); Masanori Komura, Yokohama (JP); Hiroshi Kanno, Kawasaki (JP); Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 12/705,010

(22) Filed: Feb. 12, 2010

(65) Prior Publication Data

US 2010/0202186 A1    Aug. 12, 2010

(30) Foreign Application Priority Data

Feb. 12, 2009    (JP) .................................. 2009-030109

(51) Int. Cl.
*H01L 45/00*    (2006.01)

(52) U.S. Cl. ............ 257/2; 257/314; 257/379; 257/211; 257/536; 257/E45.001; 257/E21.09

(58) Field of Classification Search .............. 257/2, 314, 257/211, 379, 536, E45.001, E21.09
See application file for complete search history.

(56) References Cited

U.S. PATENT DOCUMENTS 7,558,100 B2    7/2009    Ahn et al.

FOREIGN PATENT DOCUMENTS

JP    2008-78663    4/2008

OTHER PUBLICATIONS

U.S. Appl. No. 12/834,255, filed Jul. 12, 2010, Sato, et al.

*Primary Examiner* — Long Pham
(74) *Attorney, Agent, or Firm* — Oblon, Spivak, McClelland, Maier & Neustadt, L.L.P.

(57) ABSTRACT

A semiconductor memory device includes first and second memory cells each including a variable resistance element and a diode and having a pillar shape, and an insulating layer provided between the first memory cell and the second memory cell and including a void. A central portion of the diode has a smaller width than widths of upper and lower portions of the diode.

10 Claims, 15 Drawing Sheets

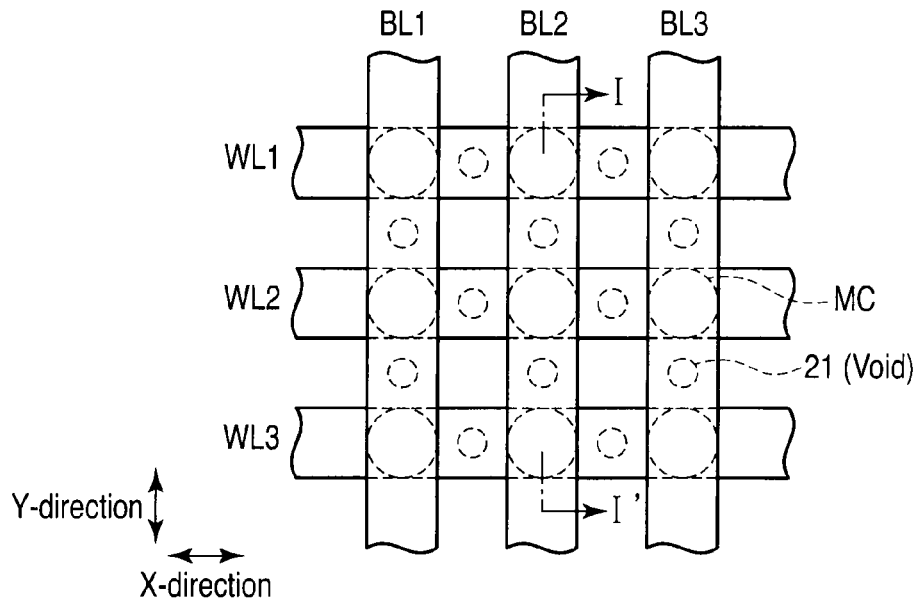
F I G. 1
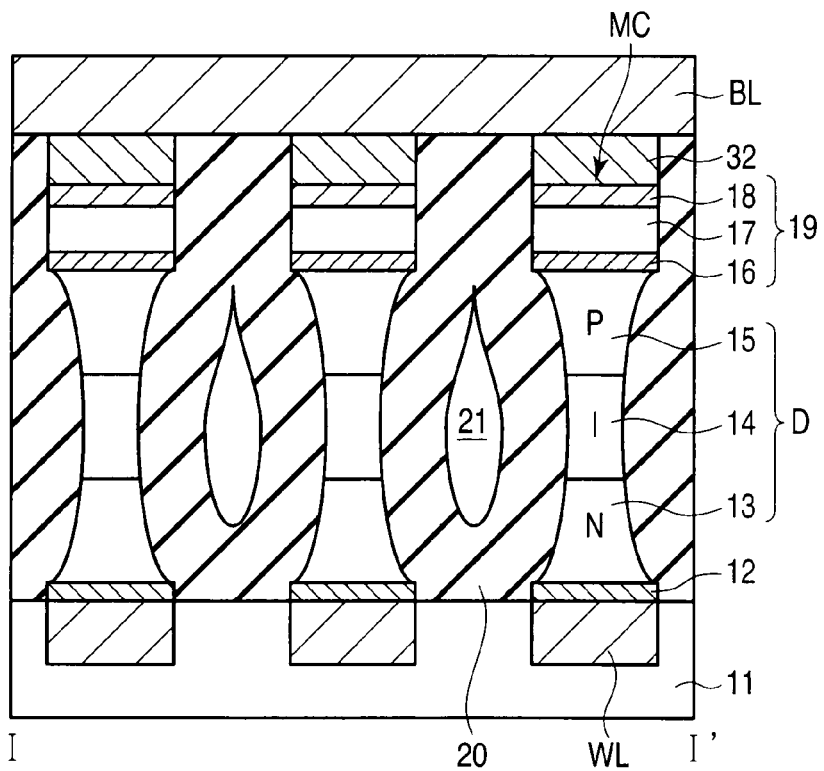
F I G. 2

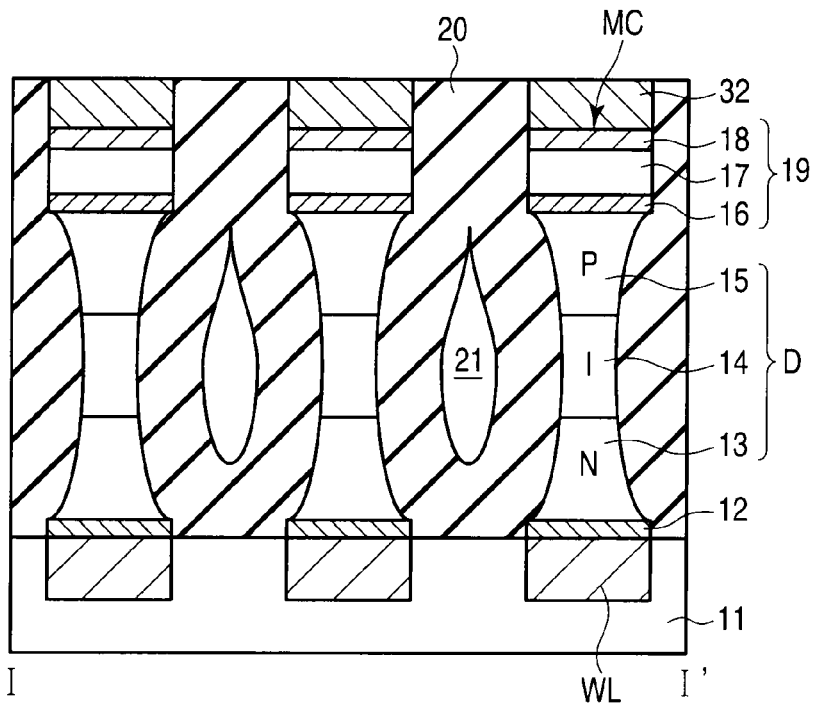
F I G. 9
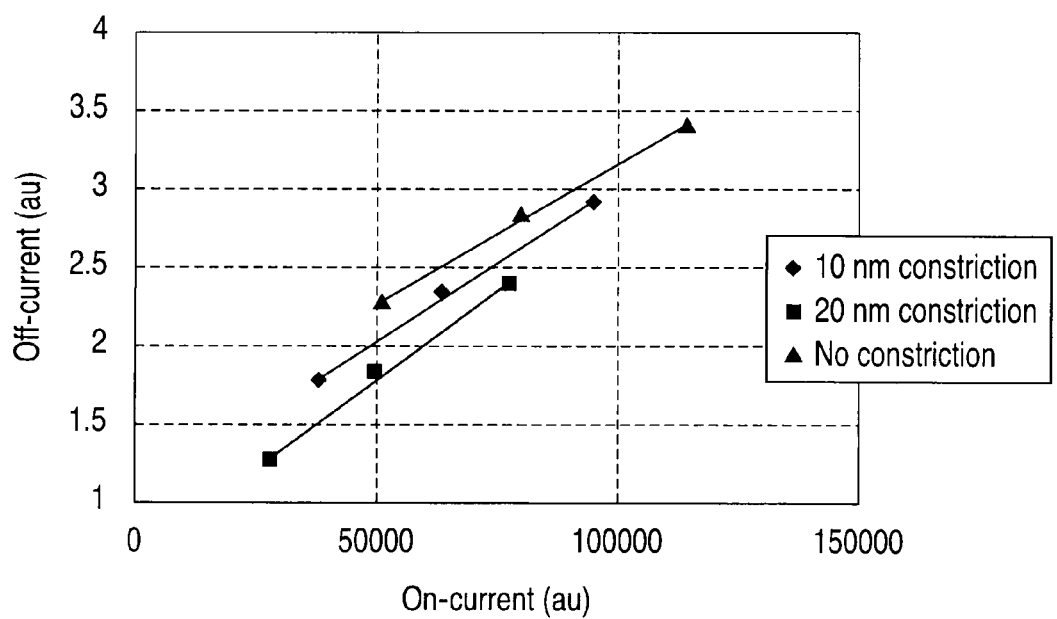
F I G. 10

| Device size | Minimum permissible width | Maximum degree of constriction |
|---|---|---|
| 45nm±9nm | 5nm | 31nm (16nm) |
| 35nm±7nm | 5nm | 23nm (12nm) |
| 25nm±5nm | 5nm | 15nm (8nm) |
F I G. 11
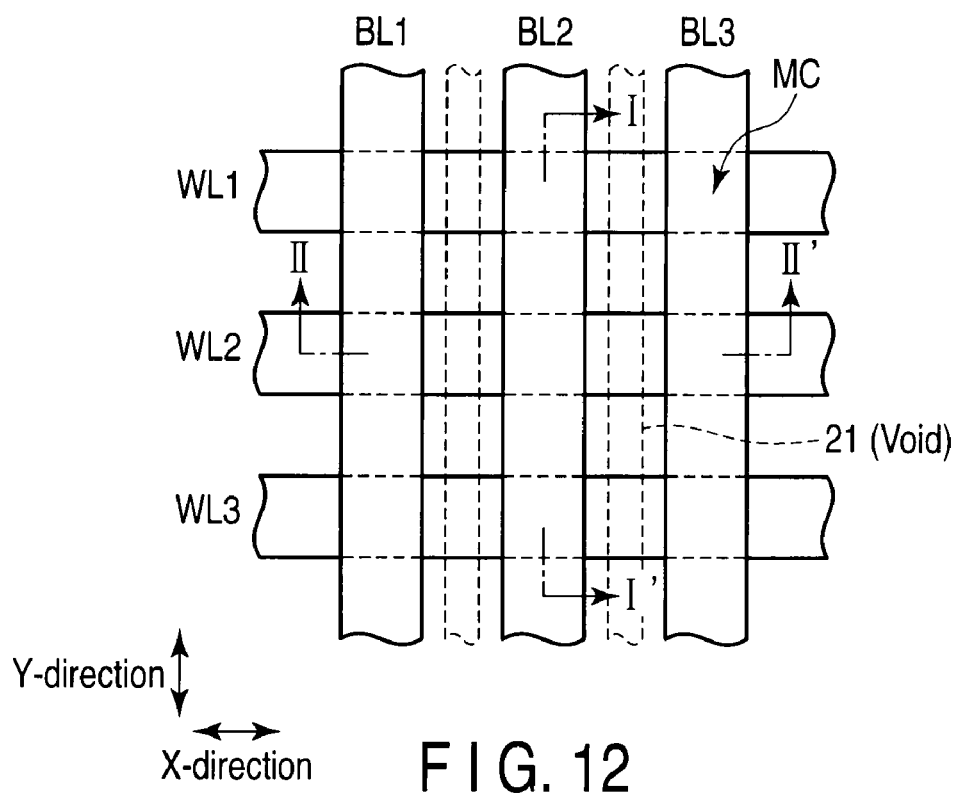
F I G. 12

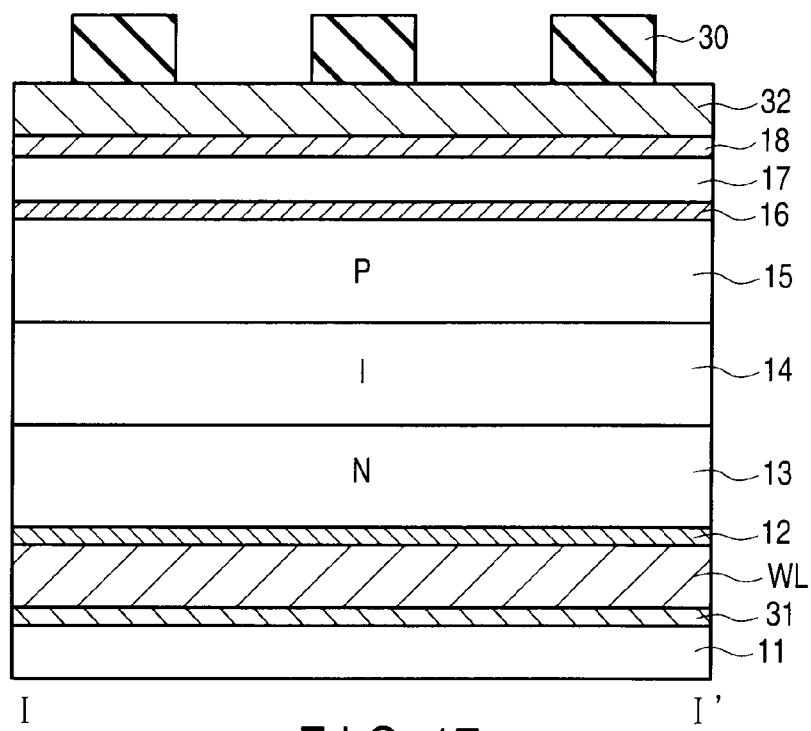
F I G. 17
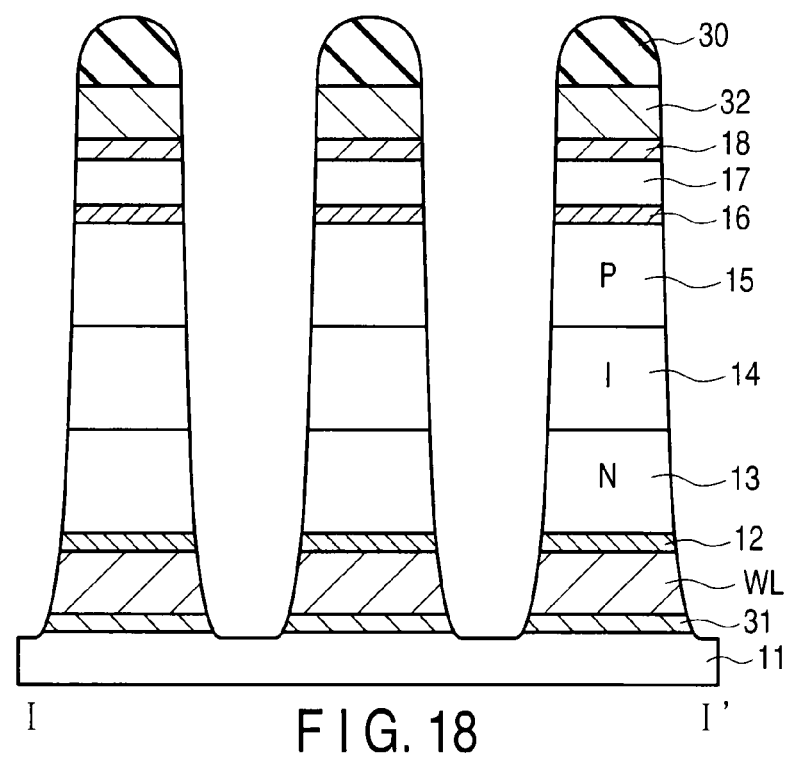
F I G. 18

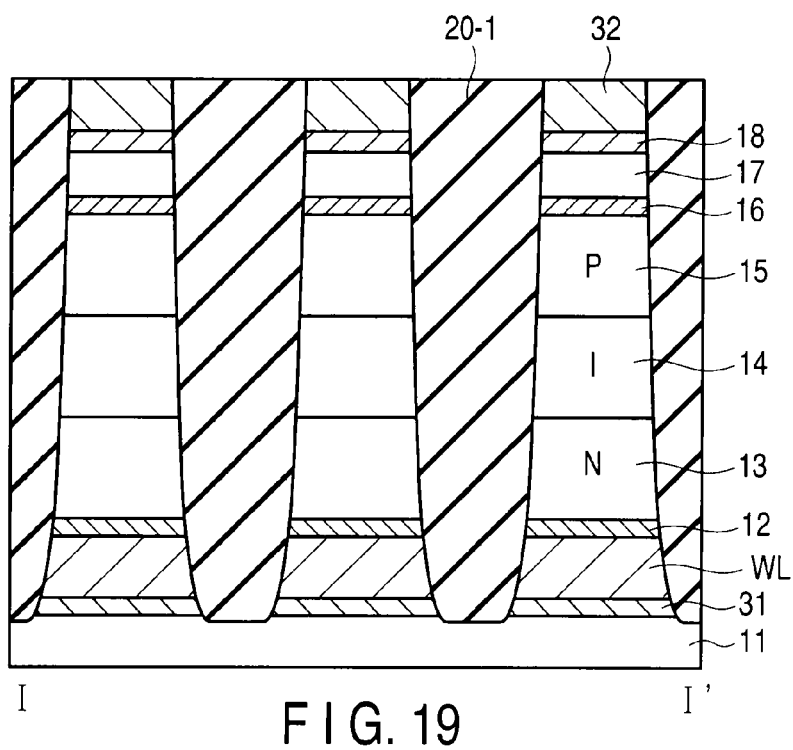
F I G. 19
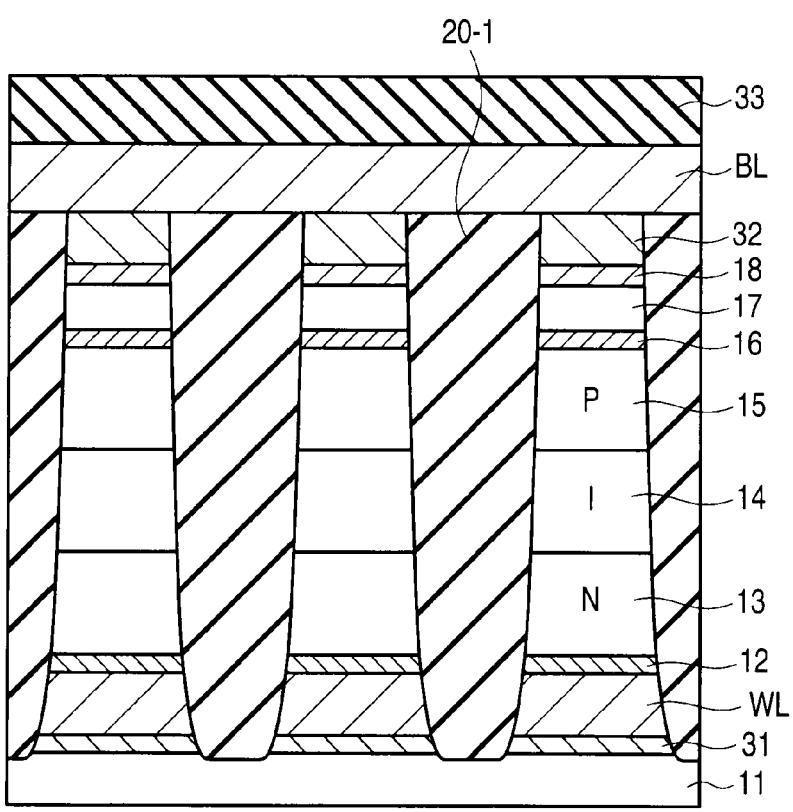
F I G. 20

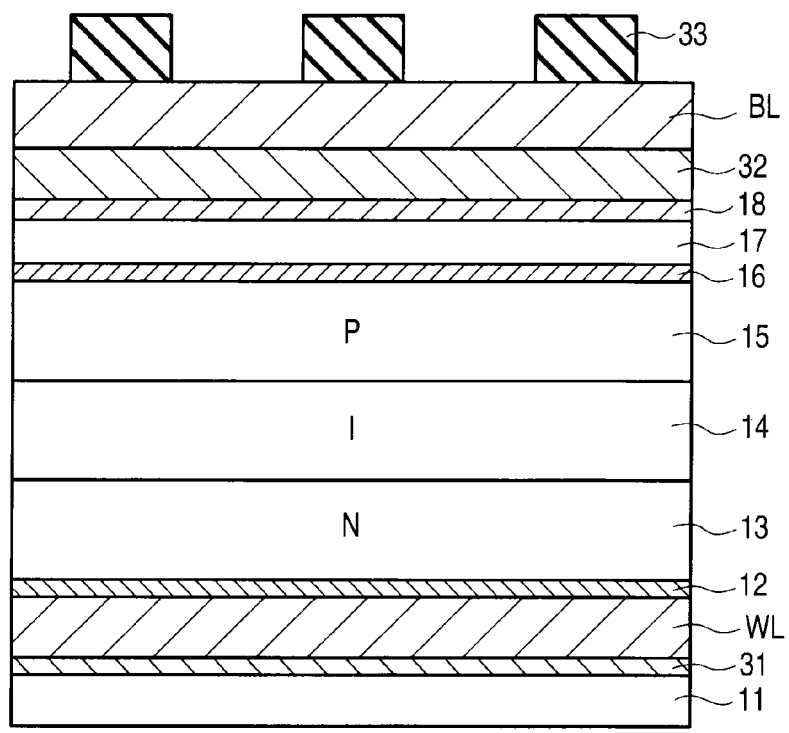
F I G. 21
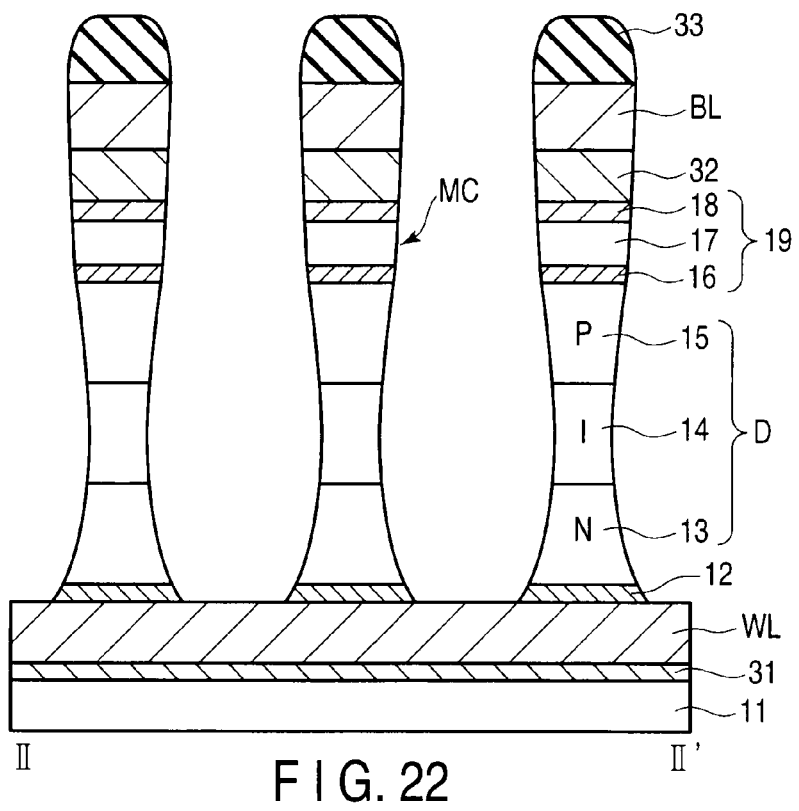
F I G. 22

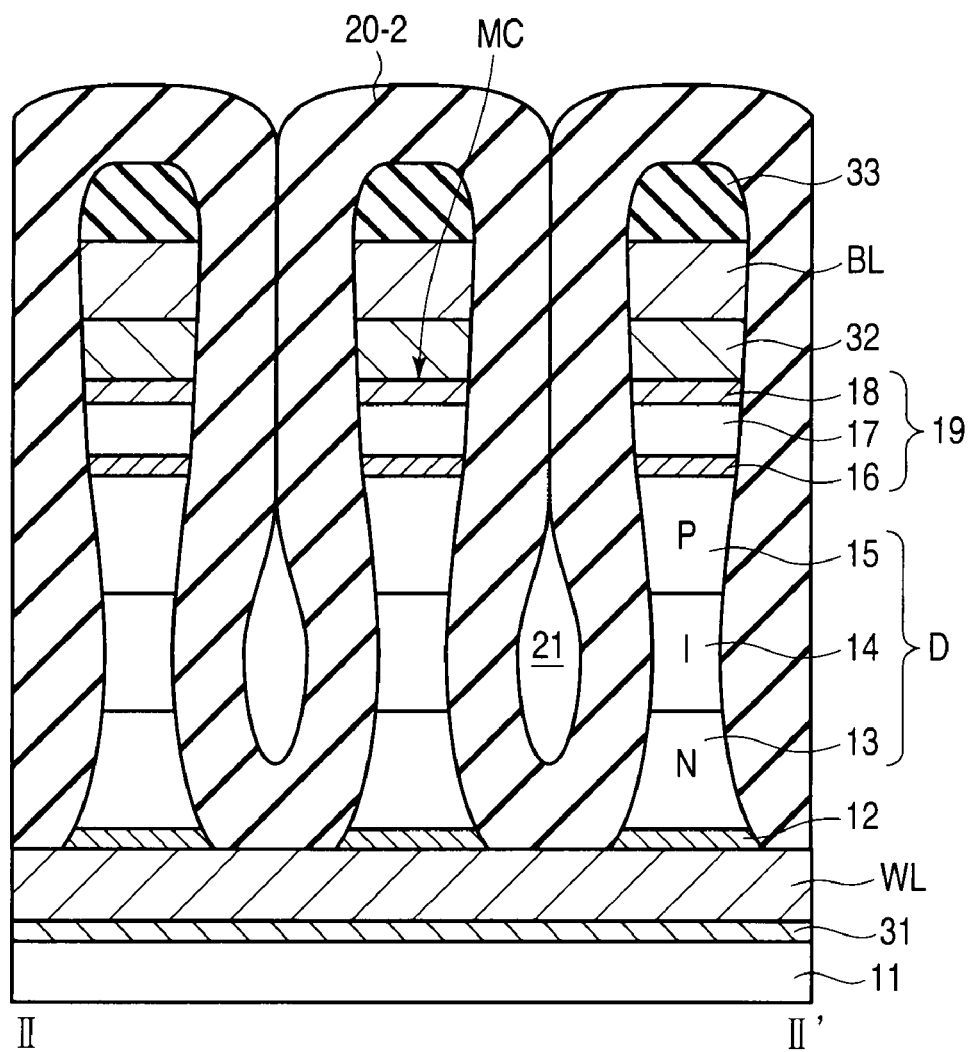
F I G. 23

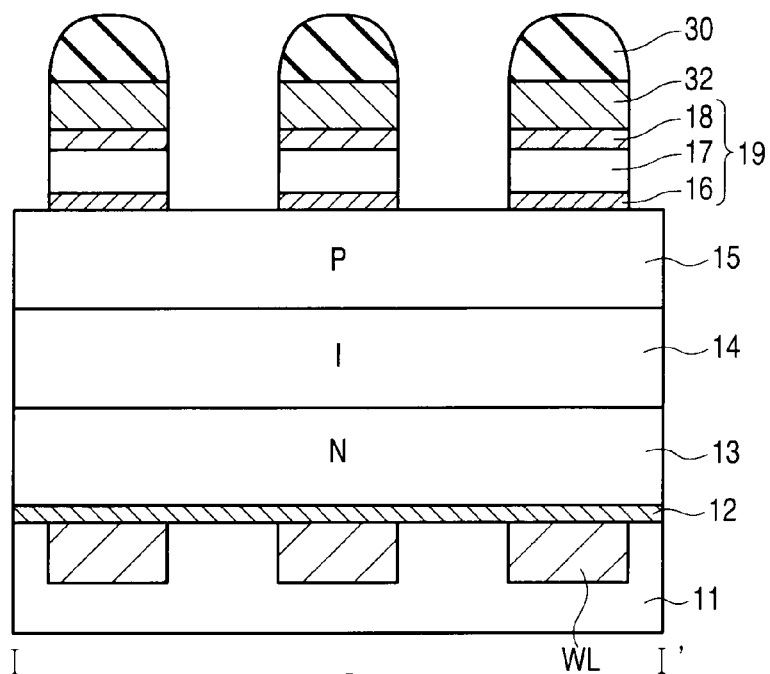
F I G. 24
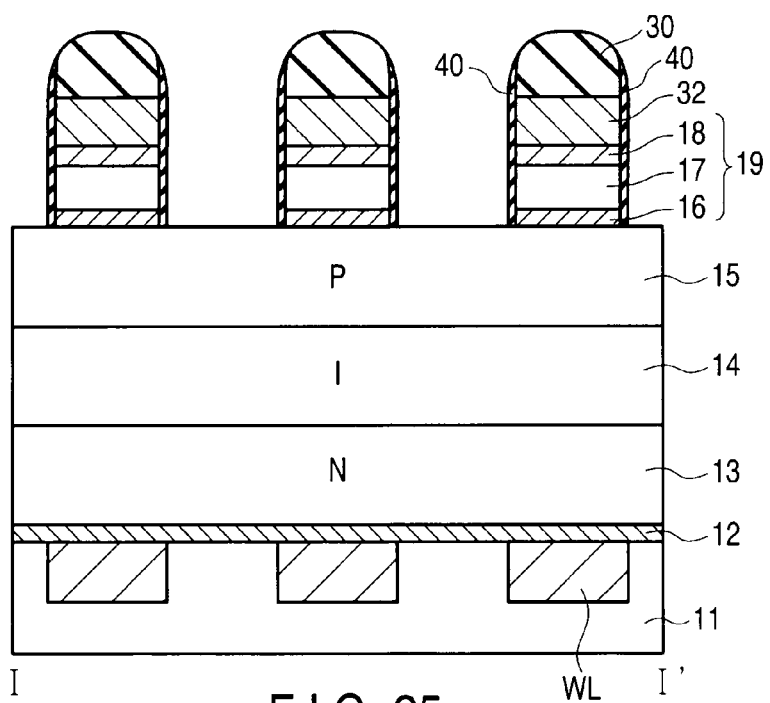
F I G. 25

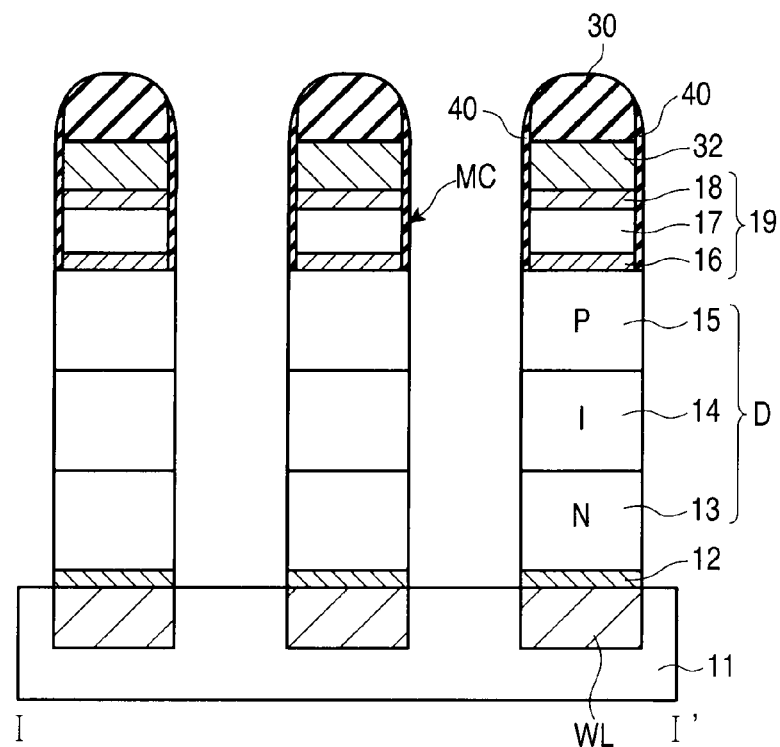
F I G. 26
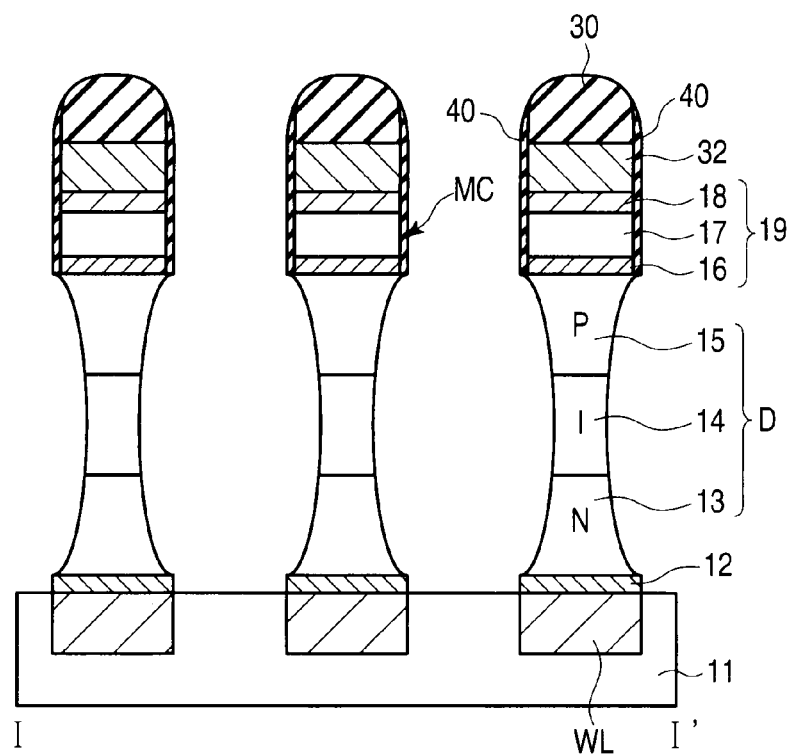
F I G. 27

SEMICONDUCTOR MEMORY DEVICE, METHOD OF MANUFACTURING THE SAME, AND METHOD OF SCREENING THE SAME

CROSS-REFERENCE TO RELATED APPLICATIONS

This application is based upon and claims the benefit of priority from prior Japanese Patent Application No. 2009-030109, filed Feb. 12, 2009, the entire contents of which are incorporated herein by reference.

BACKGROUND OF THE INVENTION

1. Field of the Invention

The present invention relates to a semiconductor memory device, a method of manufacturing the same, and a method of screening the same, and more particularly to a nonvolatile semiconductor memory device comprising a variable resistance element as a memory element, for example.

2. Description of the Related Art

In order to improve memory device densities with the same design rule (F), there is a scheme of decreasing the area necessary to form one bit. Similarly, by forming the same memory configuration in a vertically stacked configuration, the memory device densities can also be improved. A cross-point-type memory cell is an example of a way to achieve them. According to this configuration, since a storage region is formed in the area where the upper interconnect and the lower interconnect cross each other, a cell area per one bit can be decreased. Further, its simple configuration is suitable for vertically stacking layers.

A cross-point-type memory cell can be memory-operated by being combined with a variable resistance element such as a phase-change random access memory (PCRAM) and a resistive random access memory (ReRAM). By rewriting/determining the resistance value of the memory element interposed between the upper interconnect and the lower interconnect, binary 0 and 1 can be stored/read. In this case, in order to prevent an error when reading memory data, a diode with a rectifying function, as well as a memory element, is usually added to the memory element.

A PIN diode is a representative diode used as a memory cell of a cross-point-type memory cell. The PIN diode is formed using silicon. By forming an intrinsic semiconductor layer, into which impurities are not introduced, between an N-type semiconductor layer and a P-type semiconductor layer, a reverse leakage current is suppressed, and a withstand voltage in a reverse direction is improved. When the thickness of the intrinsic semiconductor layer increases, the characteristics in the reverse direction are improved and the forward current decreases. Further, when the impurity concentration of the N-type semiconductor layer and the P-type semiconductor layer increases, the forward current increases because of decrease in resistance, but the heat during the process causes impurities to diffuse into the intrinsic semiconductor layer and the characteristics in the reverse direction degrade. Thus, the characteristics in the forward and reverse directions are in trade-off relationship with regard to changes in various configurations or processes.

A document (Jpn. Pat. Appln. KOKAI Publication No. 2008-78663) discloses a structure of a phase change memory device that does not degrade in data retention properties even at high temperature.

BRIEF SUMMARY OF THE INVENTION

According to an aspect of the present invention, there is provided a semiconductor memory device comprising: first and second memory cells each including a variable resistance element and a diode and having a pillar shape; and an insulating layer provided between the first memory cell and the second memory cell and including a void, wherein a central portion of the diode has a smaller width than widths of upper and lower portions of the diode.

According to an aspect of the present invention, there is provided a method of manufacturing a semiconductor memory device, comprising: forming a stacked film in which a diode and materials of a variable resistance element is sequentially stacked on a lower interconnect layer; forming a pillar-shaped memory cell by processing the stacked film; and thinning a central portion of the diode.

According to an aspect of the present invention, there is provided a method of screening a semiconductor memory device. The device comprises: a plurality of word lines extending in a first direction; a plurality of bit lines extending in a second direction crossing the first direction; and a memory cell electrically connected to a word line and a bit line and including a variable resistance element and a diode, a central portion of the diode having a smaller width than widths of upper and lower portions of the diode. The method comprises: applying a predetermined voltage to a bit line and a word line electrically connected to a failure memory cell; and breaking a diode of the failure memory cell.

BRIEF DESCRIPTION OF THE SEVERAL VIEWS OF THE DRAWING

FIG. 1 is a plan view illustrating a configuration of a semiconductor memory device according to the first embodiment;

FIG. 2 is a cross-sectional view of a semiconductor memory device along line I-I' shown in FIG. 1;

FIG. 9 is a cross-sectional view illustrating a manufacturing process of the semiconductor memory device following FIG. 8;

FIG. 10 is a graph indicating relationship between on-current and off-current of a PIN diode D;

FIG. 11 illustrates the relationship between the device size and the maximum degree of constriction;

FIG. 12 is a plan view illustrating a configuration of a semiconductor memory device according to the second embodiment;

FIG. 17 is a cross-sectional view along line I-I' illustrating the manufacturing process of the semiconductor memory device following FIG. 16;

FIG. 18 is a cross-sectional view along line I-I' illustrating the manufacturing process of the semiconductor memory device following FIG. 17;

FIG. 19 is a cross-sectional view along line I-I' illustrating the manufacturing process of the semiconductor memory device following FIG. 18;

FIG. 20 is a cross-sectional view along line I-I' illustrating the manufacturing process of the semiconductor memory device following FIG. 19;

FIG. 21 is a cross-sectional view along line II-II' illustrating the manufacturing process of the semiconductor memory device following FIG. 19;

FIG. 22 is a cross-sectional view along line II-II' illustrating the manufacturing process of the semiconductor memory device following FIG. 21;

FIG. 23 is a cross-sectional view along line II-II' illustrating the manufacturing process of the semiconductor memory device following FIG. 22;

FIG. 24 is a cross-sectional view illustrating the manufacturing process of the semiconductor memory device according to the third embodiment;

FIG. 25 is a cross-sectional view illustrating the manufacturing process of the semiconductor memory device following FIG. 24;

FIG. 26 is a cross-sectional view illustrating the manufacturing process of the semiconductor memory device following FIG. 25;

FIG. 27 is a cross-sectional view illustrating the manufacturing process of the semiconductor memory device following FIG. 26.

DETAILED DESCRIPTION OF THE INVENTION

Figure 3:
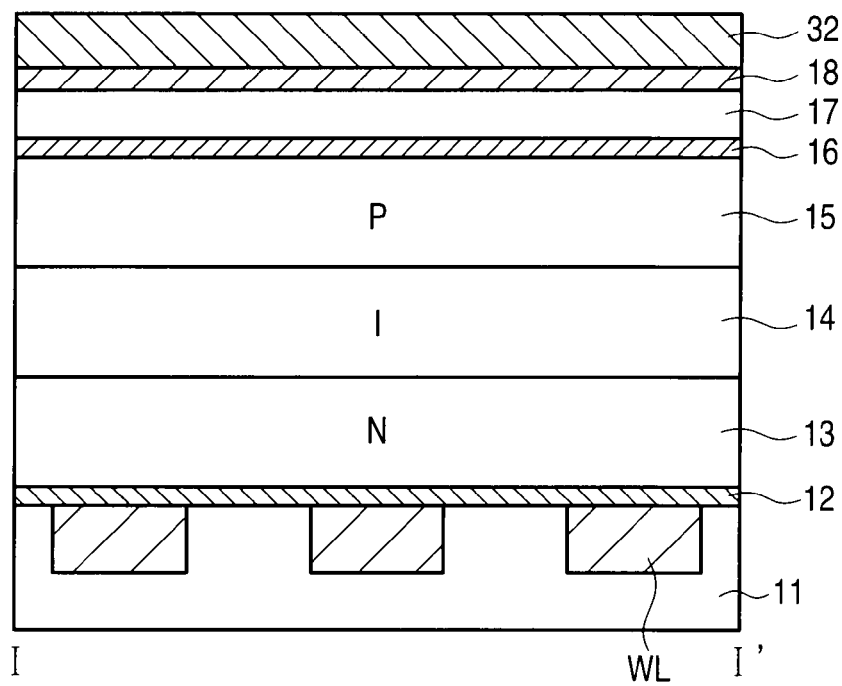
FIG. 3 is a cross-sectional view illustrating a manufacturing process of the semiconductor memory device according to the first embodiment.

The embodiments of the present invention will be described hereinafter with reference to the accompanying drawings. In the description which follows, the same or functionally equivalent elements are denoted by the same reference numerals, to thereby simplify the description.

First Embodiment

FIG. 1 is a plan view illustrating a configuration of a semiconductor memory device according to the first embodiment of the present invention. FIG. 2 is a cross-sectional view of the semiconductor memory device along line I-I' shown in FIG. 1. The semiconductor memory device of the present embodiment is a resistance variable memory, in which a variable resistance element is used as a memory cell.

For example, an interlayer insulating layer 11 formed of silicon oxide ($SiO_2$), for example, is provided on an arbitrary level layer formed on a silicon monocrystal substrate (not shown), for example. In the interlayer insulating layer 11, a plurality of lower interconnect layers are provided so as to extend in the X-direction. The lower interconnect layers correspond to word lines WL. For simplification, three word lines WL1-WL3 are shown in FIG. 3.

Above the word lines WL are provided a plurality of upper interconnect layers so as to extend in the Y-direction crossing the X-direction. The upper interconnect layers correspond to bit lines BL. For simplification, three bit lines BL1-BL3 are shown in FIG. 1.

A plurality of memory cells MC are provided in regions where the word lines WL and the bit lines BL cross one another. That is, the semiconductor memory device of the present embodiment is a cross-point-type resistance variable memory.

The planar shape of the memory cell MC is not particularly limited. In the present embodiment, the planar shape of the memory cell MC is circular, for example. The memory cell MC is formed in the shape of a pillar, for example, and is formed of a variable resistance element 19 as a memory element, and a PIN diode D as a rectifying element, which are connected in series.

More specifically, in order to prevent metal from reacting with silicon (Si) of the PIN diode D, a barrier film 12 is provided on the word line WL. On the barrier film 12 is provided the PIN diode D, in which the N-type semiconductor layer 13, an intrinsic semiconductor layer (I layer) 14, and a P-type semiconductor layer 15 are sequentially stacked. On the PIN diode D is arranged the variable resistance element 19, in which a lower electrode 16, a recording layer 17, and an upper electrode 18 are sequentially stacked. On the variable resistance element 19 is provided a protective film 32, which protects the memory cell MC and functions as a stopper at the time of chemical mechanical polishing (CMP).

The recording layer (variable resistance film) 17 can assume resistance values of greater than or equal to at least 2 as a multistable or bistable state at least at room temperature. By writing and reading the two stable resistance values, memory operation of the at least two values is implemented.

The width of the PIN diode D is smaller around the intrinsic layer than at upper and lower portions. More specifically, the width of the I layer 14 is smaller than the widths of the N-type semiconductor layer 13 and the P-type semiconductor layer 15. The PIN diode D has a concave side surface, which is constricted around the center. The cross sections of the memory cell MC cut in any directions are the same as the one shown in FIG. 2. Accordingly, the PIN diode D is constricted around the intrinsic layer.

An interlayer insulating layer 20 is provided on the interlayer insulating layer 11 and the word lines WL, and between the memory cells MC. A void 21 is provided in the interlayer insulating layer 20 and between the memory cells MC that are adjacent to each other in the X-direction (between the PIN diodes D, more specifically). Similarly, a void 21 is also provided in the interlayer insulating layer 20 and between the memory cells MC that are adjacent to each other in the Y-direction (between the PIN diodes D, more specifically). The bit line BL is provided on the upper electrode 18 and the interlayer insulating layer 20.

(Material)

Next, an example of the material of each layer forming the semiconductor memory device will be described.

Materials that can be used to form the upper interconnect layer (bit line BL) and the lower interconnect layer (word line WL) include a stacked film of tungsten (W) or aluminum (Al) and a barrier layer made of titanium nitride (TiN), for example. The upper interconnect layer and the lower interconnect layer have a thickness of approximately 30-200 nm.

Materials that can be used to form the barrier film 12 include titanium nitride (TiN) or a stacked film of titanium (Ti) and titanium nitride (TiN). The thickness of the barrier film 12 is approximately 3-20 nm. In order to form the protective film 32, tungsten (W), for example, is used. The thickness of the protective film 32 is approximately 20-100 nm.

Silicon (Si) is used to form the PIN diode D. More specifically, an N-type semiconductor layer 13 forming the PIN diode D is formed by introducing a donor such as phosphorus (P) into silicon (Si), the I layer 14 is formed of an intrinsic semiconductor layer, the P-type semiconductor layer 15 is formed by introducing an acceptor such as boron (B) into silicon (Si). The thickness (height) of the PIN diode D is approximately 50-300 nm.

The lower electrode 16 is formed of a stacked film of titanium silicide and titanium nitride (TiN), for example. That is, by interposing titanium (Ti) between titanium nitride (TiN) and silicon (Si) and siliciding the titanium (Ti), titanium silicide is formed in an interface between the PIN diode D and the titanium nitride (TiN). By providing titanium silicide in an interface between the PIN diode D and the titanium nitride (TiN), the interface resistance can be lowered. Titanium nitride (TiN), for example, is used as the upper electrode 18. Each of the lower electrode 16 and the upper electrode 18 is approximately 5-30 nm. The interlayer insulating layer 20 is formed of silicon oxide ($SiO_2$), for example.

The recording layer (variable resistance film) 17 is formed of $NiO_x$, $CoO_x$, $TiO_x$, $NbO_x$, $TaO_n$, $CeO_x$, $HfO_x$, $ZrO_x$, $MnO_x$, $CrO_x$, $FeO_x$, $CrO_x$, $CuO_x$, or the like. The recording layer 17 has a thickness of approximately 2-50 nm.

(Manufacturing Method)

Next, an example of the method of manufacturing the semiconductor memory device with the configuration shown in FIGS. 1 and 2 will be described with reference to the drawings.

As shown in FIG. 3, the interlayer insulating layer 11 formed of silicon oxide ($SiO_2$), for example, is deposited on an arbitrary level layer formed on a silicon monocrystal substrate (not shown), for example. After that, a plurality of lower interconnect layers (word lines WL) are formed in the interlayer insulating layer 11 through damascene method. More specifically, a plurality of trenches having the shape same as that of the word lines WL are formed in the interlayer insulating layer 11. After that, an interconnect material is deposited in the trenches, and then a top surface of the interlayer insulating layer 11 is planarized such that only the trench portions of the interconnect material remain. Thereby, a plurality of linear word lines WL, which extend in the X-direction, are formed in the interlayer insulating layer 11.

After that, the barrier film 12, the materials of the PIN diode D (the N-type semiconductor layer 13, the I layer 14, and the P-type semiconductor layer 15), the lower electrode 16, the recording layer 17, the upper electrode 18, and the protective film 32 are sequentially deposited on the word lines WL and the interlayer insulating layer 11. The PIN diode D is formed by selectively introducing source gas containing phosphorous (P) or boron (B) while the silicon layer is formed. As a result, the PIN diode comprises the N-type semiconductor layer, the P-type semiconductor layer, and the intrinsic semiconductor layer that does not include impurities (or have a sufficiently low impurity concentration). Alternatively, the PIN diode D may be formed by ion implantation after the silicon layer is formed.

Figure 4:
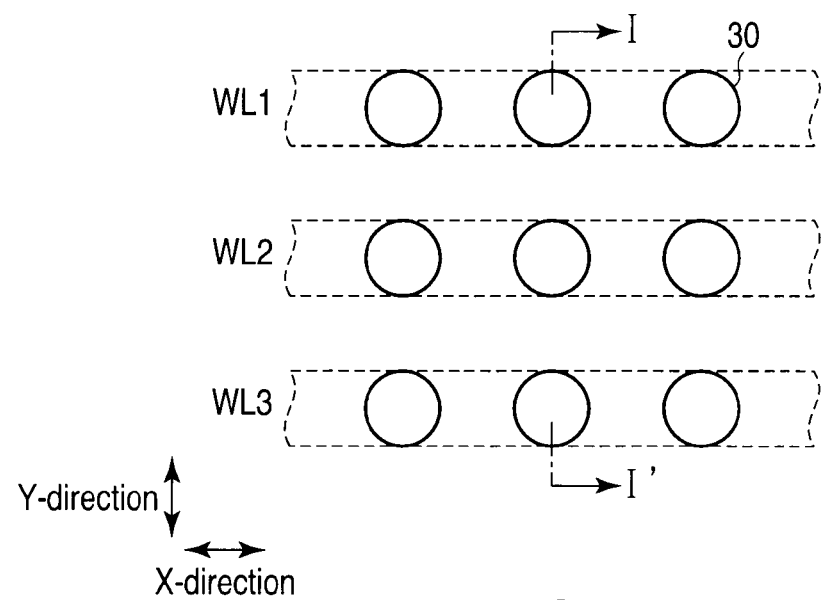
FIG. 4 is a plan view illustrating a manufacturing process of the semiconductor memory device following FIG. 3.
Figure 5:
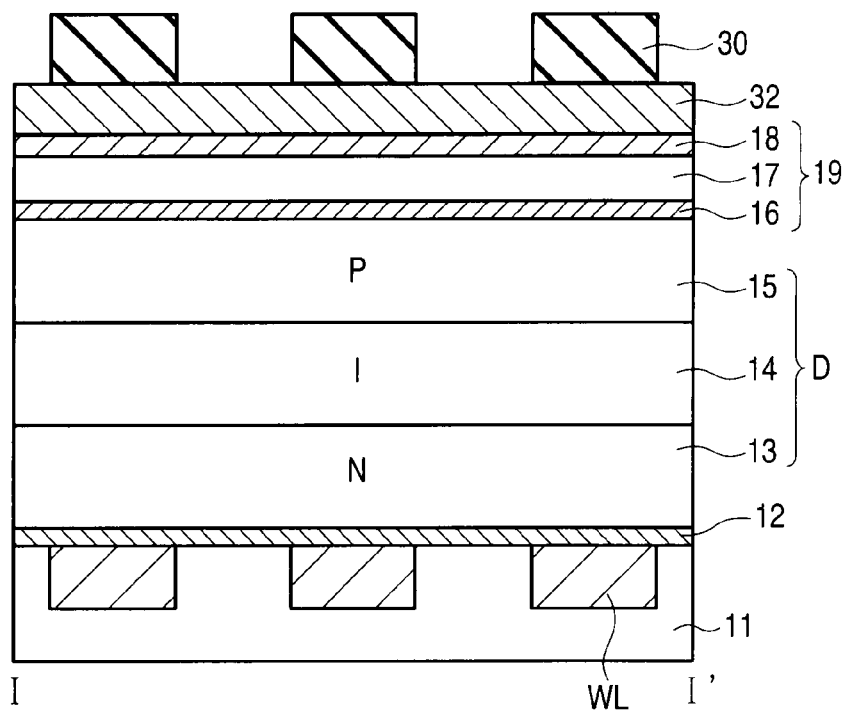
FIG. 5 is a cross-sectional view illustrating a manufacturing process of the semiconductor memory device following FIG. 3.

Next, as shown in FIG. 4 (plan view) and FIG. 5 (cross-sectional view), hard mask layers 30 are formed on the protective film 32 and the regions where the memory cells MC are to be formed, through lithography and reactive ion etching (RIE). The planar shape of the hard mask layer 30 is the same as the planar shape of the memory cell MC. Silicon oxide, silicon oxynitride, or silicon nitride, is used as the hard mask layer 30.

Figure 6:
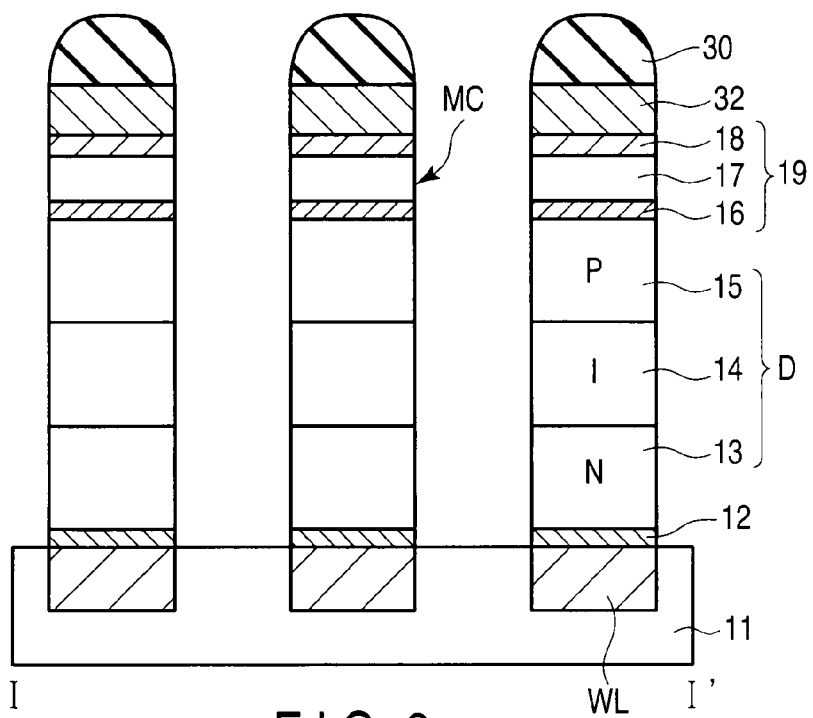
FIG. 6 is a cross-sectional view illustrating a manufacturing process of the semiconductor memory device following FIG. 5.

After that, as shown in FIG. 6, the protective film 32, the upper electrode 18, the recording layer 17, the lower electrode 16, the P-type semiconductor layer 15, the I layer 14, the N-type semiconductor layer 13, and the barrier film 12 are etched through RIE method, for example, and a plurality of pillar-shaped memory cells MC are formed.

Figure 7:
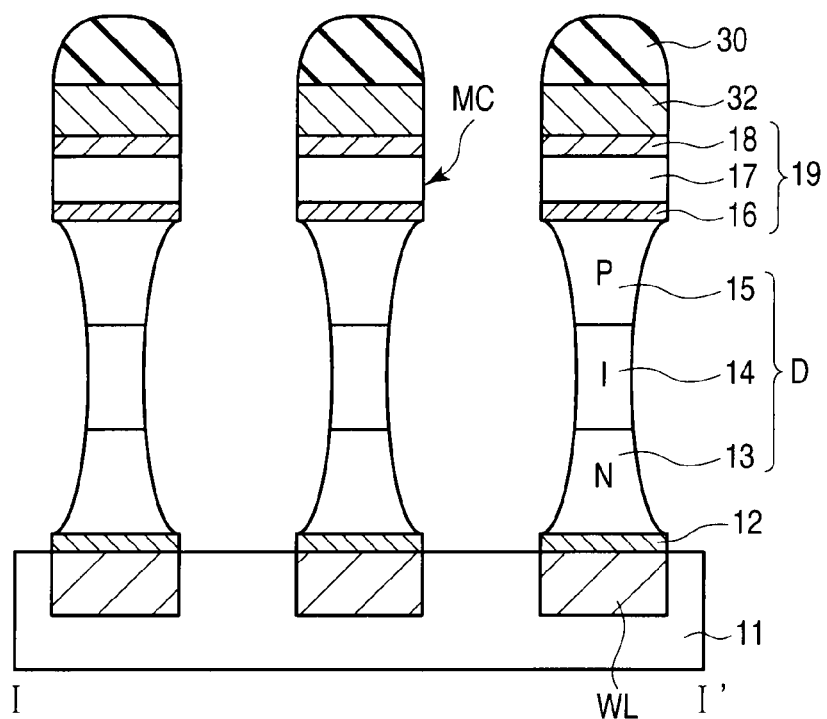
FIG. 7 is a cross-sectional view illustrating a manufacturing process of the semiconductor memory device following FIG. 6.

After that, as shown in FIG. 7, the PIN diode D is thinned through wet etching using alkali solution. Thereby, the PIN diode D constricted around the intrinsic layer is formed. It is known that the etching rate of silicon (Si) against alkali solution is lower as the impurity concentration is higher. Accordingly, the PIN diode D constricted at the I layer 14, which has a low impurity concentration, is formed. Trimethyl 2-oxy-ethyl ammonium hydroxide (TM-Y) or potassium hydroxide (KOH) is used as the solution used in wet etching.

The PIN diode D constricted around the intrinsic layer may be formed by controlling etching conditions of the RIE process (manufacturing process of FIG. 6) of forming the pillar-shaped memory cells MC. The RIE process can be controlled by changing the etching gas, for example, as appropriate. More specifically, the upper electrode 18, the recording layer 17, and the lower electrode 16 are processed using a gaseous mixture of chlorine ($Cl_2$) and argon (Ar). Following that, approximately ¼ from the top of the silicon layer (the P-type semiconductor layer 15, the I layer 14, and the N-type semiconductor layer 13) is processed using a gaseous mixture of hydrogen bromide (HBr) and oxygen ($O_2$). In this case, a reaction product is formed on a circumferential surface of the silicon layer. After that, by mixing fluorine (F) into the etching gas so as to increase the isotropic component of etching, approximately ¾ of the silicon layer is processed while the silicon layer is also shaved in the crosswise direction. At the last, fluorine (F) is removed from the etching gas and approximately ¼ of the silicon layer is processed. As a result of the above-described RIE process, the PIN diode D constricted around the intrinsic layer is formed.

Figure 8:
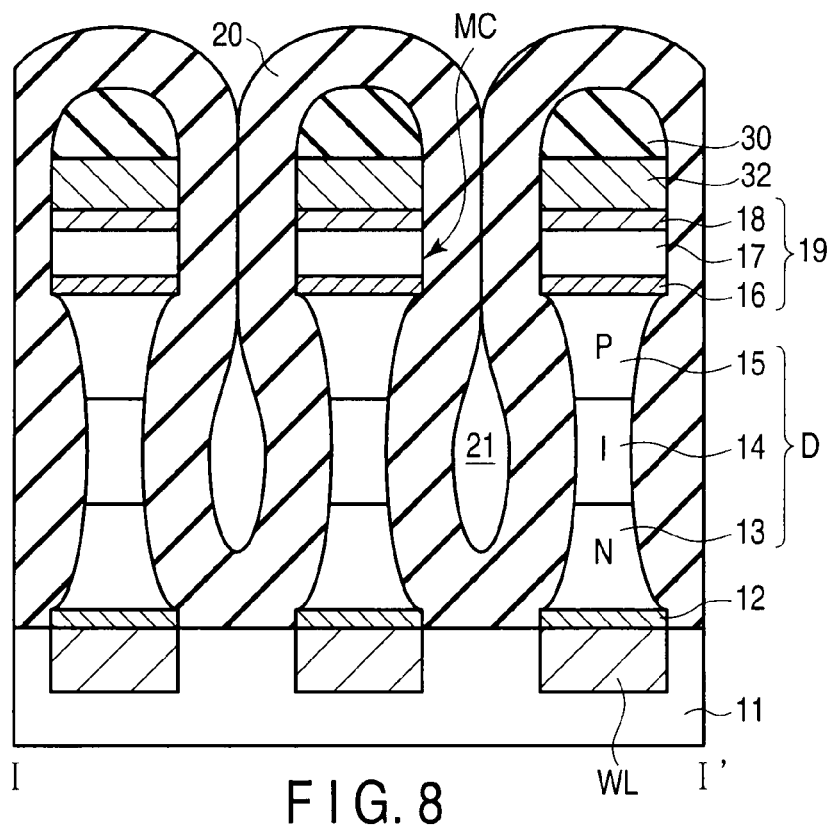
FIG. 8 is a cross-sectional view illustrating a manufacturing process of the semiconductor memory device following FIG. 7.

After that, as shown in FIG. 8, the interlayer insulating layer 20 formed of silicon oxide ($SiO_2$), for example, is deposited on the entire surface of the sample, so as to fill in the gaps between the memory cells MC. Thereby, the lower and upper portions of the memory cells MC are filled with the interlayer insulating layer 20, and the voids 21 are produced adjacent to the PIN diodes D because of the constriction of the PIN diodes D. In order to stably form the voids 21, the PIN diode D needs to be constricted at its central portion by at least 3 nm.

After that, as shown in FIG. 9, the interlayer insulating layer 20 is planarized so as to expose the protective film 32, through CMP method. Then, as shown in FIGS. 1 and 2, an interconnect material is deposited on the protective film 32, and the interconnect material is patterned through lithography and RIE method. Thereby, a plurality of upper interconnect layers (bit lines BL) are formed on the protective film 32. Thereby, the semiconductor memory device according to the first embodiment is manufactured.

Next, characteristics of the PIN diode D according to the present embodiment will be described. A forward current that flows when a forward voltage is applied to the PIN diode D is proportional to the volume of the N-type semiconductor layer 13 and the P-type semiconductor layer 15 forming the PIN diode D. That is, the forward current If of the PIN diode D is expressed by the following formula:

If $\propto$ Volumes of N-type semiconductor layer and P-type semiconductor layer, where $\propto$ denotes proportionality.

The main component of a reverse current that flows when a reverse voltage is applied to the PIN diode D is a surface leakage current. The surface leakage current is produced because of surface discontinuity, surface roughness, or surface attachment of the PIN diode D, and is a leakage current that flows through a surface region of the PIN diode D. The surface leakage current is proportional to the peripheral length of the PIN diode D, and is inversely proportional to the length of the PIN diode D (longitudinal length shown in FIG. 2). That is, the reverse current Ir of the PIN diode D is expressed by the following formula:

$$Ir \propto 1/\int dx/2\pi r,$$

where r denotes the radius of the PIN diode D.

The PIN diode D having a cross-sectional shape shown in FIG. 2 can decrease the peripheral length of the central portion of the PIN diode D without approximately decreasing the volume of the N-type semiconductor layer 13 and the P-type semiconductor layer 15. It is thereby possible to reduce the surface leakage current without decreasing the forward current.

Assume that a device is formed to have the minimum feature size of 45 nm, for example. Considering an error of approximately 20%, the size of the memory cells MC (i.e., size of the PIN diode D) is 45±10 nm. An evaluation was performed on the PIN diode D with this size between the forward current and the reverse current.

FIG. 10 is a graph illustrating the relationship between the forward current (on-current) and the reverse current (off-current) of the PIN diode D with the size of 45 nm. The horizontal axis represents the on-current and the longitudinal axis represents the off-current, in an arbitrary unit. FIG. 10 shows graphs of three cases, where there is no constriction (degree of constriction is zero), the degree of constriction is 10 nm, and the degree of constriction is 20 nm. The degree of constriction denotes the total constriction, and is the value obtained by subtracting the width of the constricted portion from the device size.

FIG. 10 provides comparison between off-currents of the three graphs with respect to the same on-current. FIG. 10 shows that the off-current, i.e., the surface leakage current, can be lowered as the degree of constriction increases. That is, the PIN diode D is improved in leakage current characteristics as the degree of constriction increases.

Considering actual processing, the PIN diode D needs to be processed reliably such that the PIN diode D will not be bent or broken, and needs to be resistant to mechanical stress after processing. In consideration of such conditions, the PIN diode D needs to have the minimum permissible width of approximately nm at the constricted portion.

FIG. 11 shows the maximum degree of constriction in three cases, where the device size is 45, 35, and 25 nm. The device size may include an error of approximately 15-20% due to variation in size at the time of lithography or processing. FIG. 11 is a calculated result of the case where the error of the device size is approximately 20%. The minimum permissible width at the constricted portion of the PIN diode D is approximately 5 nm in all the device sizes. The maximum degree of constriction is the value obtained by subtracting the width of the maximum constricted portion from the device size. The values in the parentheses of FIG. 11 denote the degrees of constriction of one side.

For example, when the device dimension is 25 nm, the error is 25×0.2=5 nm, the maximum degree of constriction is 25×0.8−5=15 nm, and the degree of constriction of one side is approximately half of the maximum degree of constriction, i.e., 8 nm. That is, when the device dimension is 25 nm, the PIN diode D can be constricted up to 15 nm.

In short, the maximum degree of constriction of the PIN diode D is expressed by L-5-error nm, where the size of the diode is L nm, the minimum permissible width of the central portion is 5 nm, and the manufacturing error is size L of 15-20%. As described above, in order to stably form the voids 21, the degree of constriction of the central portion of the PIN diode D needs to be at least approximately 3 nm. Considering the conditions, the degree of constriction of the PIN diode D is set within the range of:

3 nm to L-5-error nm.

As described above, according to the first embodiment, the memory cells MC are formed by stacking and connecting in series the PIN diode D and the variable resistance element 19, and are arranged in matrix in regions where the word lines WL and the bit lines BL cross. Further, the PIN diode D is formed so as to have a narrower width around the intrinsic layer than at its upper or lower portions, i.e., so as to be constricted around the intrinsic layer. Moreover, the voids 21 are formed in the interlayer insulating layer 20 between the most adjacent memory cells MC.

The above-described first embodiment obtains the advantageous effects as will be described below.

First, since the area of the interface between the lower electrode 16 and the P-type semiconductor layer 15 can be kept large, the contact resistance can be suppressed from increasing. Similarly, since the area of the interface between the barrier film 12 and the N-type semiconductor layer 13 can be kept large, the contact resistance can be suppressed from increasing.

Second, the volume of upper and lower high-concentration layers (N-type semiconductor layer 13 and P-type semiconductor layer 15), which function as resistance, can be kept large, and the resistance of the PIN diode D can be suppressed from increasing.

Third, by decreasing the peripheral length of the central portion of the PIN diode D and increasing the length of the PIN diode D in the direction in which the current flows, a reverse leakage current caused by a surface leakage current can be suppressed. As a result of the first to third effects, the forward current of the PIN diode D is prevented from decreasing, and the reverse leakage current can be suppressed.

Fourth, when the device size has decreased, the interference between adjacent bits becomes more obvious. In the first embodiment, the voids 21 exist in the most adjacent memory cells MC. Since the voids 21 have high insulating properties, thermal and electric interference between the memory cells can be suppressed. Thereby, even when the memory cell densities are increased, a semiconductor memory device that causes few defects and malfunctions can be configured.

In the present embodiment, the lower interconnect layer (word line WL) may be formed through RIE method. The upper interconnect layer (bit line BL) are formed through damascene method.

Second Embodiment

In the second embodiment, the semiconductor memory device is manufactured by a manufacturing method different from that of the first embodiment. Because of the manufacturing method of the second embodiment, the position of the voids and the shape of the PIN diode D are different from those of the first embodiment.

Figure 13:
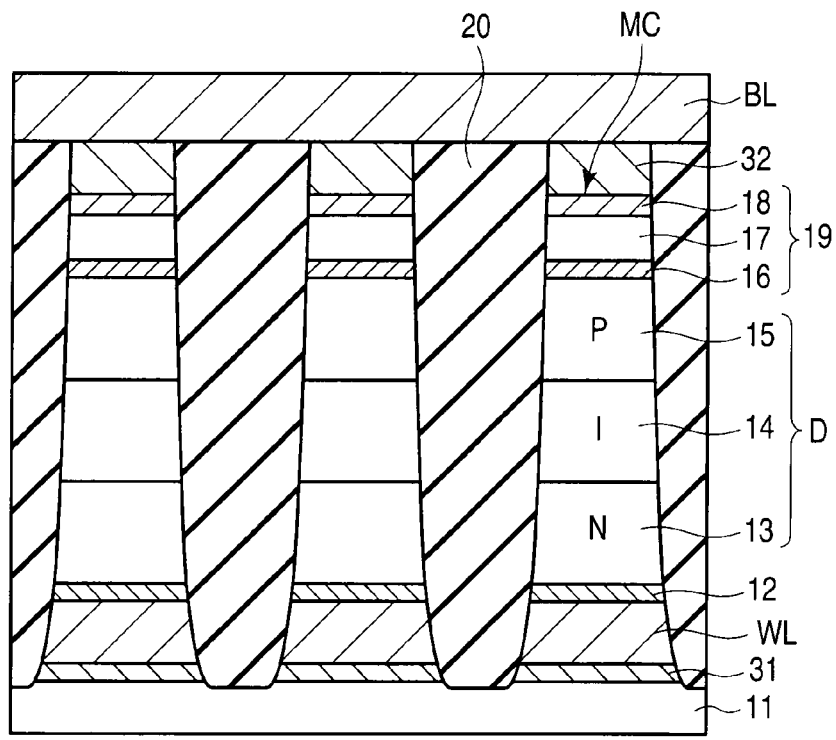
FIG. 13 is a cross-sectional view along line I-I' shown in FIG. 12.
Figure 14:
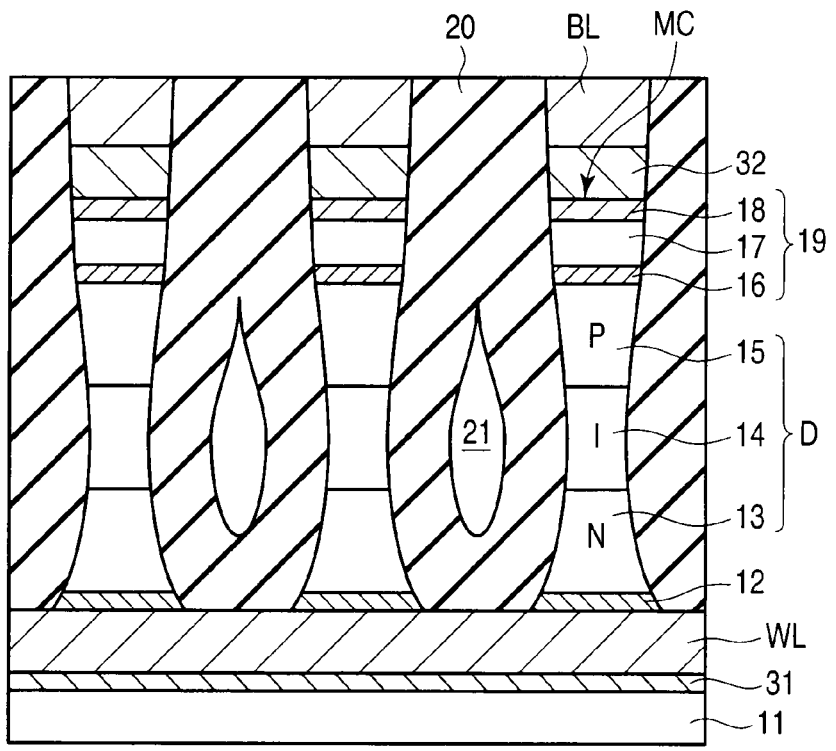
FIG. 14 is a cross-sectional view along line II-II' shown in FIG. 12.

FIG. 12 shows a plan view illustrating the configuration of the semiconductor memory device according to the second embodiment. FIG. 13 is a cross-sectional view of the semiconductor memory device along line I-I' shown in FIG. 12. FIG. 14 is a cross-sectional view of the semiconductor memory device along line II-II' shown in FIG. 12.

For example, an interlayer insulating layer 11 formed of silicon oxide ($SiO_2$), for example, is provided on an arbitrary level layer formed on a silicon monocrystal substrate (not shown). On the interlayer insulating layer 11 are provided a plurality of lower interconnect layers (word lines WL), so as to extend in the X-direction, via a barrier film 31, which prevents metal from diffusing into the interlayer insulating layer 11. Materials used as the barrier film 31 include titanium nitride (TiN), and a stacked film of titanium nitride (TiN) and titanium (Ti). The barrier film 31 has a thickness of approximately 3-20 nm. Above the word lines WL are provided a plurality of upper interconnect layers (bit lines BL) so as to extend in the Y-direction.

In the regions where the word lines WL and the bit lines BL cross, a plurality of memory cells MC are provided. The planar shape of the memory cell MC is a rectangle. The memory cell MC is formed in the shape of a pillar, and is formed of a variable resistance element 19 as a memory element and a PIN diode D as a rectifying element, which are connected in series.

More specifically, a barrier film 12 is provided on the word line WL, so as to prevent metal from reacting with silicon (Si) of the PIN diode D. On the barrier film 12 is provided the PIN diode D. On the PIN diode D is provided a variable resistance element 19. On the variable resistance element 19 is provided the protective film 32, which protects the memory cell MC and functions as a stopper at the time of CMP process.

An interlayer insulating layer 20 is provided on the interlayer insulating layer 11 and the word line WL, and between the memory cells MC. Voids 21 are provided in the interlayer insulating layer 20 and between the memory cells MC that are adjacent to each other in the X-direction (between the PIN diodes D, more specifically). The voids 21 are formed so as to extend in the Y-direction. In the second embodiment, voids do not exist between the memory cells MC that are adjacent to each other in the Y-direction, unlike the first embodiment. Bit lines BL are provided on the protective film 32 and the interlayer insulating layer 20.

As shown in FIG. 14, the cross-section of the PIN diode D in the X-direction has a narrower width around the intrinsic layer than at its upper and lower portions. In other words, the PIN diode D is constricted around the intrinsic layer. The conditions of the degree of constriction are the same as those of the first embodiment.

On the other hand, the cross-section of the memory cell MC in the Y-direction has a forward tapered shape. That is, the cross-section in the Y-direction of the PIN diode D is not constricted around the intrinsic layer.

(Manufacturing Method)

Next, an example of the method of manufacturing the semiconductor memory device with the configuration shown in FIGS. 12-14 will be described with reference to the drawings.

Figure 15:
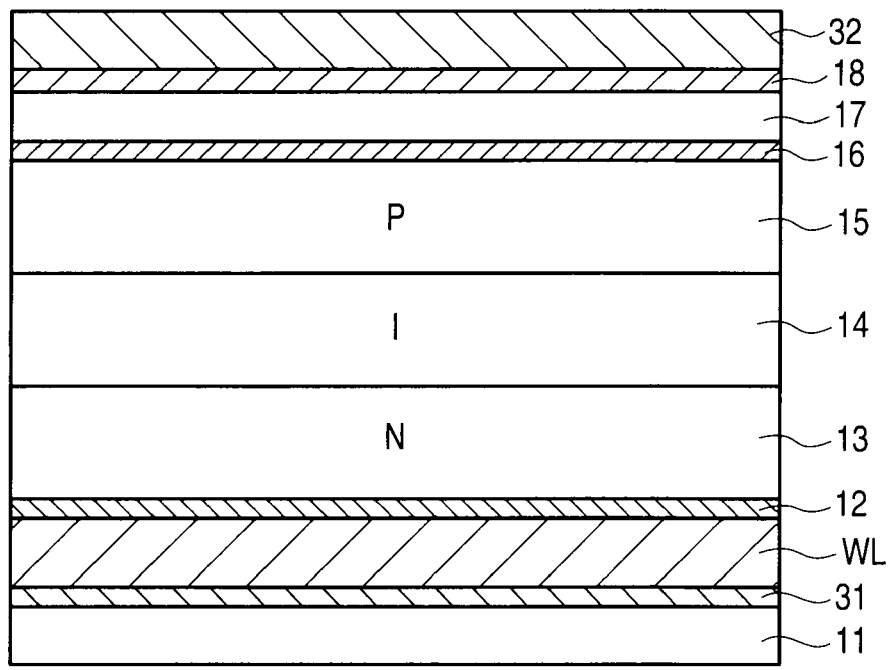
FIG. 15 is a cross-sectional view along line I-I' indicating the manufacturing process of the semiconductor memory device according to the second embodiment.

As shown in FIG. 15, the interlayer insulating layer 11 formed of silicon oxide (SiO2), for example, is deposited on an arbitrary level layer formed on a silicon monocrystal substrate (not shown). After that, the barrier film 31, the lower interconnect layer (word line WL), the barrier film 12, the materials of the PIN diode D (the N-type semiconductor layer 13, the I layer 14, and the P-type semiconductor layer 15), the lower electrode 16, the recording layer 17, the upper electrode 18, and the protective film 32 are sequentially deposited on the interlayer insulating layer 11.

Figure 16:
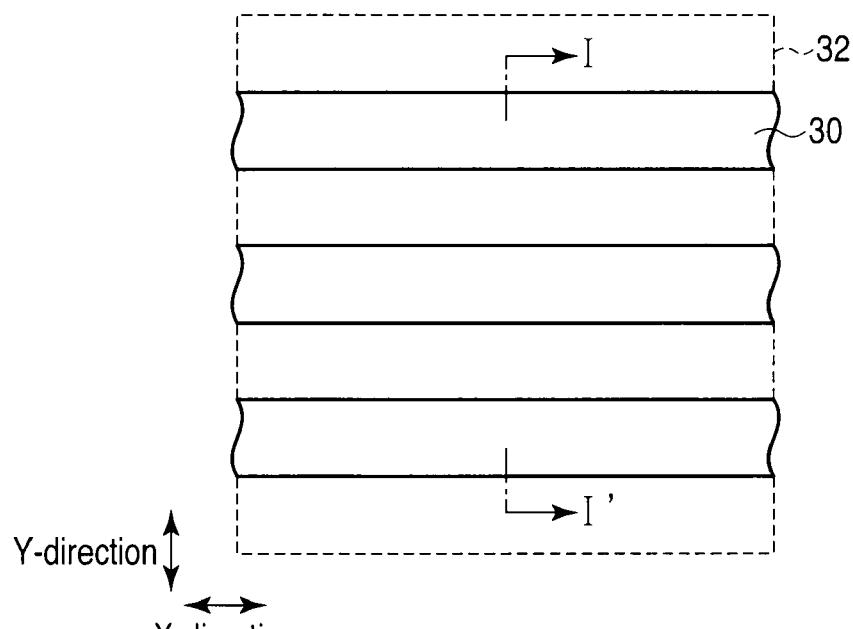
FIG. 16 is a plan view illustrating the manufacturing process of the semiconductor memory device following FIG. 15.

After that, as shown in FIGS. 16 (plan view) and 17 (cross-sectional view), a plurality of linear hard mask layers 30 are formed on the protective film 32 so as to have the same planar shape as that of the word lines WL shown in FIG. 12, through lithography and RIE method. The materials used as the hard mask layer 30 include silicon oxide, silicon oxynitride, and silicon nitride, for example.

After that, as shown in FIG. 18, the protective film 32, the upper electrode 18, the recording layer 17, the lower electrode 16, the P-type semiconductor layer 15, the I layer 14, the N-type semiconductor layer 13, the barrier film 12, the word line WL, and the barrier film 31 are etched through RIE method and the stacked film is divided in linear shapes. In this case, the linear stacked films have forward tapered cross-sections in the Y-direction.

After that, as shown in FIG. 19, an interlayer insulating layer 20-1 formed of silicon oxide (SiO$_2$), for example, is deposited on the entire surface of the sample. After that, the top surface of the interlayer insulating layer 20-1 is planarized through CMP method, using the protective film 32 as a stopper. Thereby, the gaps between the linear stacked films are filled with the interlayer insulating layer 20-1. In this case, voids are not formed in the interlayer insulating layer 20-1.

After that, as shown in FIG. 20 (cross-section in the Y-direction) and FIG. 21 (cross-section in the X-direction), an upper interconnect layer (bit line BL) is deposited on the protective film 32 and the interlayer insulating layer 20-1. After that, a plurality of linear hard mask layers 33 are formed on the bit lines BL so as to have the same planar shape as that of the bit lines BL of FIG. 12. The materials used as the hard mask layer 33 include silicon oxide, silicon oxynitride, and silicon nitride.

After that, as shown in FIG. 22, the bit line BL, the protective film 32, the upper electrode 18, the recording layer 17, the lower electrode 16, the P-type semiconductor layer 15, the I-layer 14, the N-type semiconductor layer 13, the barrier film 12, and the interlayer insulating layer 20-1 existing under the region between the bit lines BL are etched through RIE method. Thereby, a plurality of pillar-shaped memory cells MC are formed. In this case, the etching conditions are controlled and the PIN diode D is thinned so as to form the PIN diode D that is constricted around the intrinsic layer. As described in the first embodiment, after the memory cells MC having forward tapered cross-sections are formed through RIE method, the PIN diode D constricted around the intrinsic layer may be formed through wet etching using alkali solution.

After that, as shown in FIG. 23, an interlayer insulating layer 20-2 formed of silicon oxide (SiO2), for example, is deposited on the entire surface of the sample, so as to fill in the gaps between the memory cells MC.

Thereby, the lower and upper portions of the memory cells MC are filled with the interlayer insulating layer 20-2, and the voids 21 are produced adjacent to the PIN diode D because of the constriction of the PIN diode D. In order to stably form the voids 21, the PIN diode D needs to be constricted at its central portion by at least 3 nm.

After that, as shown in FIG. 14, the interlayer insulating layer 20 is planarized so as to expose the bit lines BL, through CMP process. Thereby, the semiconductor memory device according to the second embodiment is manufactured.

As described above, according to the second embodiment, the pillar-shaped memory cells MC are formed using two RIE processes, where the word lines WL and the bit lines BL are processed. Further, the PIN diode D is formed so as to have a narrower width around the intrinsic layer than at its upper or lower portions, i.e., so as to be constricted around the intrinsic layer. Further, the voids 21 are formed between the memory cells MC adjacent in the X-direction.

Accordingly, according to the second embodiment, it is possible to miniaturize and concentrate the memory cells MC while decreasing the number of manufacturing steps. Thereby, it is possible to reduce the manufacturing cost. The other advantageous effects are the same as those of the first embodiment.

Third Embodiment

In the third embodiment, the semiconductor memory device is manufactured using a manufacturing method different from that of the first embodiment. More specifically, a PIN diode D constricted around the intrinsic layer is formed while processing damage to a variable resistance element 19 is reduced.

The manufacturing processes up to FIG. 5 are the same as those of the first embodiment. After that, as shown in FIG. 24, the protective film 32, the upper electrode 18, the recording layer 17, and the lower electrode 16 are etched through RIE method so that the top surface of the P-type semiconductor layer 15 is exposed. After that, a circumferential wall 40 formed of silicon nitride (SiN), for example, is formed on the periphery of the variable resistance element 19.

After that, as shown in FIG. 26, the P-type semiconductor layer 15, the I layer 14, the N-type semiconductor layer 13, and the barrier film 12 are etched through RIE method. Thereby, a plurality of pillar-shaped memory cells MC are formed.

After that, as shown in FIG. 27, a PIN diode D constricted around the intrinsic layer is formed by thinning the PIN diode D by wet etching using alkali solution. In this case, since the variable resistance element 19 is surrounded by the circumferential wall 40, processing damage to the variable resistance element 19 can be prevented. In the RIE process (manufacturing process of FIG. 26) of forming the pillar-shaped PIN diode D, the PIN diode D constricted around the intrinsic layer may be formed. The subsequent manufacturing steps are the same as those of the first embodiment.

As described above, according to the third embodiment, only the variable resistance element 19 is processed first, and then the circumferential wall 40 is formed on the periphery of the variable resistance element 19 so as to protect the variable resistance element 19. After that, the PIN diode D is processed.

Accordingly, according to the third embodiment, the PIN diode D constricted around the intrinsic layer can be formed without considering processing damage to the variable resistance element 19, in particular, the recording layer 17. Further, the variable resistance element 19 is prevented from deteriorating in characteristics. The manufacturing method of the third embodiment may also be applied to the second embodiment.

Fourth Embodiment

The semiconductor memory device shown in the first to third embodiments comprises a plurality of memory cells MC arranged in matrix in regions where a plurality of word lines WL and a plurality of bit lines BL cross. Further, the memory cell MC comprises a variable resistance element 19 and a PIN diode D connected in series between the word line WL and the bit line BL.

In such a cross-point-type semiconductor memory device, a plurality of bits exist in one word line WL or one bit line BL. For example, assume that a PIN diode D has short-circuited in one bit because of crystal defect in the silicon (Si) or because of defect in the recording layer 17. In this case, a word line WL and a bit line BL corresponding to the bit become short-circuited and the bit becomes defective. Further, since a current always flows when a voltage difference is applied to the bit, another bit connected to the same word line WL and the bit line BL also becomes defective at the time of reading. In order to reduce cost, a large memory cell array needs to be formed. However, when such a completely short-circuited bit occurs, a large number of bits connected to a long bit line BL and a word line WL become defective simultaneously, and cause decrease in manufacturing yields.

In this case, the PIN diode D shown in the first to third embodiments has a smaller width around the intrinsic layer than at its upper and lower portions. The thin region of the PIN diode D around the intrinsic layer has higher current densities than the upper and lower regions. Consequently, when a current flows in the PIN diode D, the central portion of the PIN diode D can generate heat selectivity. If the memory cell MC has short-circuit defect, the PIN diode D is broken by letting a current flow through the memory cell MC. Thereby, the short-circuited portion can be made open and a plurality of bit defects can be prevented that would occur along the bit lines BL and the word lines WL.

Figure 28:
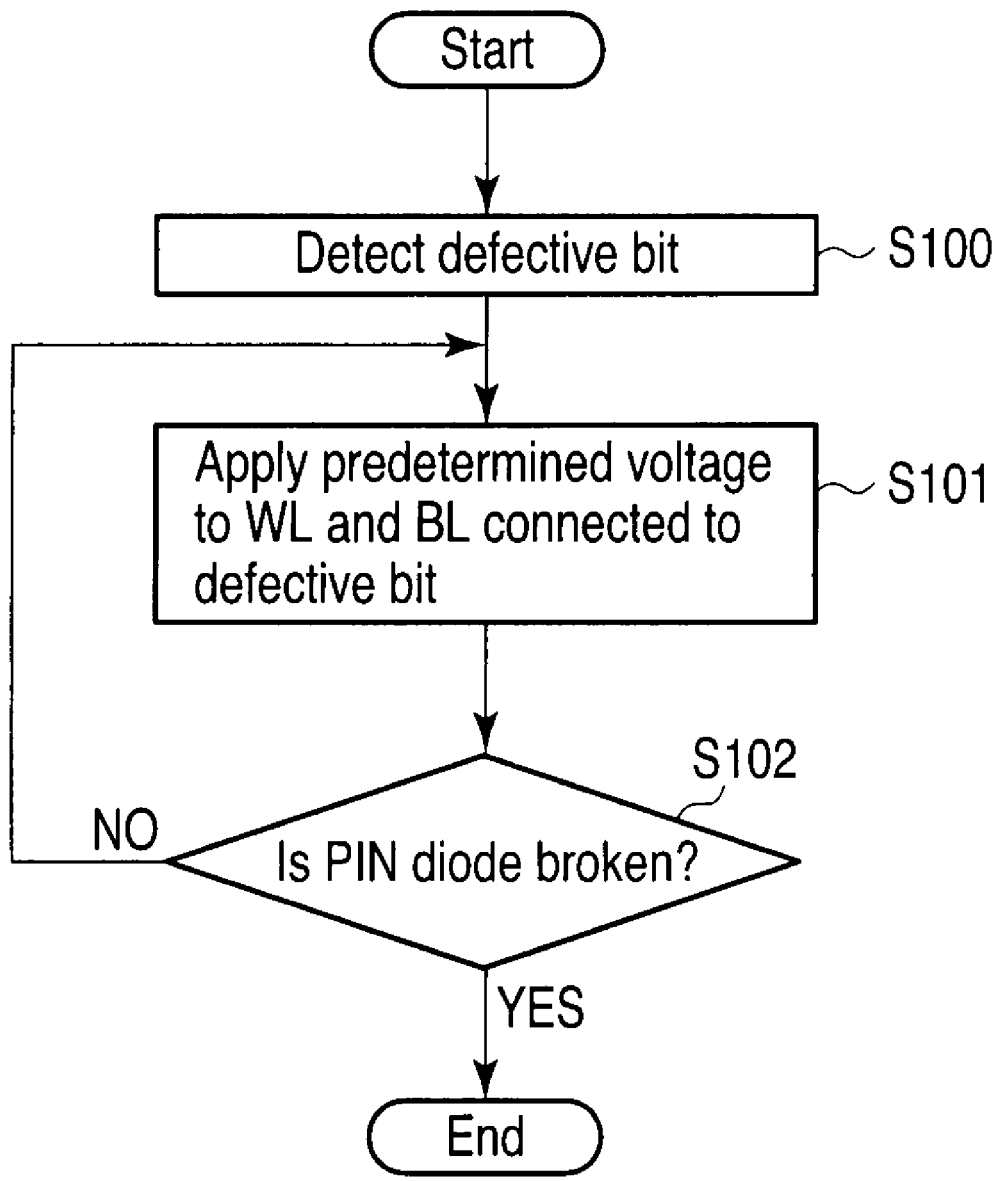
FIG. 28 is a flowchart illustrating a screening method according to the fourth embodiment of the present invention.

FIG. 28 is a flowchart illustrating a process of screening short-circuit defect in a semiconductor memory device.

First, a test of the semiconductor memory device is performed, and then a defective bit is detected (step S100). After that, the PIN diode D is broken by applying a predetermined voltage to the defective bit for a predetermined period of time (step S101).

More specifically, voltages of 3 V and 0 V are applied for a period of time of approximately 100 µs to the selective bit line and the selective word line, respectively, connected to the defective bit. Further, voltages of 0 V and 3 V are applied to a non-selective bit line and a non-selective word line other than the selective bit line and the selective word line, respectively.

After that, break of the PIN diode D of the defective bit is confirmed. That is, it is confirmed that the short-circuited portion is made open (step S102). When the short-circuited portion is not made open, the step S101 is executed again. When a plurality of defective bits exist, the break process of step S101 is performed for every defective bit.

As described above, according to the fourth embodiment, by using the semiconductor memory device shown in the first to third embodiments, when a defective bit occurs, it is possible to prevent all the bit lines and the word lines connected to the defective bit from becoming defective. It is thereby possible to prevent decrease in manufacturing yields.

In the embodiments, descriptions have been made based on a resistive random access memory (ReRAM) as an example. However, the present invention is not limited thereto, and is applicable to other variable resistance memories such as a phase change random access memory (PCRAM).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   first and second memory cells each including a variable resistance element and a diode and having a pillar shape; and
   an insulating layer provided between the first memory cell and the second memory cell and including a void,
   wherein a central portion of the diode has a smaller width than widths of upper and lower portions of the diode.

2. The device according to claim 1, wherein
the diode includes an N-type semiconductor layer, P-type semiconductor layer, and an intrinsic semiconductor layer interposed between the N-type semiconductor layer and the P-type semiconductor layer, and
the intrinsic semiconductor layer has a width smaller than widths of the N-type semiconductor layer and the P-type semiconductor layer.

3. The device according to claim 1, wherein a degree of constriction at the central portion of the diode is greater than or equal to 3 nm.

4. The device according to claim 1, wherein a degree of constriction at the central portion of the diode is less than or equal to L-E-5 nm, where L is a size of the memory cell and E is a manufacturing error.

5. The device according to claim 1, wherein a degree of constriction at the central portion of the diode is set within 3 nm to 15 nm.

6. The device according to claim 1, wherein the central portion of the diode has a minimum width of 5 nm.

7. The device according to claim 1, further comprising:
a word line extending in a first direction; and
first and second bit lines extending in a second direction crossing the first direction,
wherein the first memory cell is arranged between the word line and the first bit line, and
the second memory cell is arranged between the word line and the second bit line.

8. The device according to claim 7, wherein the void extends in the second direction.

9. The device according to claim 1, wherein the void is arranged between adjacent diodes.

10. The device according to claim 1, wherein the variable resistance element includes a lower electrode, an upper electrode, and a variable resistance film interposed between the lower electrode and the upper electrode.

* * * * *